US006603120B2

(12) United States Patent
Yamashita

(10) Patent No.: US 6,603,120 B2
(45) Date of Patent: Aug. 5, 2003

(54) TEST METHOD OF MASK FOR ELECTRON-BEAM EXPOSURE AND METHOD OF ELECTRON-BEAM EXPOSURE

(75) Inventor: Hiroshi Yamashita, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 127 days.

(21) Appl. No.: 09/870,219

(22) Filed: May 30, 2001

(65) Prior Publication Data

US 2001/0054697 A1 Dec. 27, 2001

(30) Foreign Application Priority Data

Jun. 19, 2000 (JP) ........................................ 2000-183295

(51) Int. Cl.[7] ........................... H01L 21/66; G01N 23/02
(52) U.S. Cl. .................. 250/307; 250/311; 250/492.22; 250/492.23; 430/296
(58) Field of Search .................. 250/307, 311, 250/492.2, 492.22, 492.23; 430/296

(56) References Cited

U.S. PATENT DOCUMENTS

| 5,798,194 A | * | 8/1998 | Nakasuji et al. ............. 430/296 |
| 6,509,127 B1 | * | 1/2003 | Yamashita ................... 430/296 |
| 2001/0052579 A1 | * | 12/2001 | Kawata et al. .......... 250/492.22 |

FOREIGN PATENT DOCUMENTS

| JP | 05258703 | 10/1993 |
| JP | 08124834 | 5/1996 |
| JP | 10135103 | 5/1998 |
| JP | 11176720 | 7/1999 |

OTHER PUBLICATIONS

H. Yamashita, et al. Effects of Accelerating Voltage and Pattern Size on Electron Scattering by Electron–Beam Mask. American Vacuum Society 1997 p.2263–2268 Journal of Vacuum Science & Technology, B 15 (6) Nov/Dec 1997.

H. Yamashita, et al. Proximity Effect Correction by the Ghost Method Using a Scattering Stencil Mask. American Vacuum Society 1999 p.2860–2863 J. Vac. Sci. Technol. B 17 (6), Nov./Dec. 1999.

G. Patrick Watson, et al. A Background Dose Proximity Effect Correction Technique for Scattering with Angular Limitation Projection Electron Lithography Implemented in Hardware. American Vacuum Society 1995 p.2504–2507 J. Vac. Sci. Technol. B 13 (6), Nov./Dec. 1995.

* cited by examiner

Primary Examiner—Jack Berman
(74) Attorney, Agent, or Firm—Katten Muchin Zavis Rosenman

(57) ABSTRACT

The present invention relates to a test method of a mask for electron-beam exposure which has a pattern region in which, by forming an electron-beam scatterer in prescribed shape on an electron-beam transmittable thin film, a scattering region with said electron-beam scatterer and a membrane region without said electron-beam scatterer are formed in prescribed pattern shape; wherein electron-beam irradiation onto a tested mask is carried out in a plurality of times, with each irradiated region subjected to irradiation at a time being scanned with the electron beam, and through detection of transmitted electrons which is made for each irradiated region subjected to irradiation at a time.

15 Claims, 8 Drawing Sheets

(a)

(b)

TEST METHOD OF MASK FOR ELECTRON-BEAM EXPOSURE AND METHOD OF ELECTRON-BEAM EXPOSURE

BACKGROUND OF THE INVENTION

1. Field of the Invention

The present invention relates to a test method of a mask for electron-beam exposure and a method of electron-beam exposure.

2. Description of the Related Art

An electron-beam exposure method of segmented projection type has been recently proposed as a novel method of electron-beam exposure to replace the cell projection method and the variable-shaped beam exposure method. This electron-beam exposure method of segmented projection type is a method wherein a prescribed primary pattern for projection is segmented into a plurality of divisions and every said division is subjected to exposure one by one till the whole of this prescribed primary pattern is transferred. Although the prescribed primary pattern is segmented into a plurality of divisions, this electron-beam exposure method of segmented projection type uses a mask or a pair of masks onto which the whole segmented portions of the prescribed pattern of one chip are formed in all. In this respect, the electron-beam exposure method of segmented projection type is altogether different from the variable-shaped beam exposure method wherein a pattern that is to be transferred is not actually formed onto the mask but processed as soft data or the cell projection method which employs a mask onto which only repeated parts of a prescribed pattern is formed. In consequence, this electron-beam exposure method of segmented projection type can markedly improve the throughput, compared with these conventional exposure methods.

This electron-beam exposure method of segmented projection type is explained well in the section of the prior art in Japanese Patent Application Laid-open No. 176720/1999 with reference to FIG. 2 in the publication. On the basis of this description, one example of the electron-beam exposure method of segmented projection type is described below.

FIG. 7 is a schematic view in explaining the electron-beam exposure method of segmented projection type. In FIG. 7, referential numeral 100 indicates a mask; 100a, a division on the mask 100; 100b, a demarcation region between divisions 100a; 110, a substrate, such as a wafer coated with a resist; 110a, a region for one die (one chip) on the substrate 110; 110b, a region for projection on the substrate 110, each corresponding to a division 100a; AX, an optical axis of an optical system of charged particle beam; EB, a charged particle beam and CO, a crossover point of the optical system of charged particle beam.

On the mask 100, being separated by a demarcation region 100b without a pattern, there are present numerous divisions 100a each of which is provided, on a membrane, a pattern to be transferred onto the substrate 110. Further, a support structure in the form of a grid is set over the demarcation region 100b, protecting the membrane thermally and mechanically. The mask 100 herein is a scattering membrane mask wherein, on a membrane, for example, a silicon nitride film with a thickness of 100 nm or so, there are formed electron-beam scatterer patterns made of, for example, tungsten with a thickness of 50 nm or so. This scattering membrane mask is the mask used mainly for the electron-beam exposure method of scattering-angle limiting type (referred to as "SAL type" hereinafter) and the exposure method herein is assumed to be the SAL type.

Every division 100a is provided with one of segmented patterns which the pattern that is to be transferred onto a region 110a for one die on the substrate 110 is segmented into, and every segmented pattern is transferred onto the substrate 110, one by one. The external appearance of the substrate 110 is as shown in FIG. 7(b). A section (the Va section of FIG. 7(b)) of the substrate 110 is shown in FIG. 7(a) on an enlarged scale.

In FIG. 7, the z-axis is taken parallel to the optical axis AX of the optical system of charged particle beam, and the x-axis and y-axis are taken parallel to the directions of the array of divisions 100a, respectively. While the mask 100 and the substrate 110 are moved continuously in opposite directions along the x-axis as arrows Fm and Fw indicate, respectively, patterns of divisions 100a in one line are transferred in succession through step-by-step scanning of the charged particle beam in the direction of the y-axis. After completing projection of the patterns in one line, divisions 100a in the next of that line in the direction of the x-axis receive scanning of the charged particle beam. Thereafter, in the same manner, projection (segmented projection) of divisions 100a is successively performed one by one so as to transfer the whole pattern for one die (chip).

The scanning order over the divisions 100a and the transcribing order onto the substrate 110 are presented by lines with arrowheads, Am and Aw, respectively. Hereat, the directions of movements for the mask 100 and the substrate 110 are opposite to each other, because the x-axis and y-axis for the mask 100 and the substrate 110 are reversed by a pair of projection lenses, respectively.

When the projection (segmented projection) is carried out in this manner, if patterns of divisions 100a in one line lying in the direction of the y-axis are projected on the substrate 110 by a pair of projection lenses as they are, gaps corresponding to the demarcation region 100b develop between regions for projection 110b on the substrate 110, each region for projection corresponding to a division 100a, respectively. To overcome this problem, the charged particle beam EB having passed through each division 100a is made deflected as much as the width Ly of the demarcation region 100b in the direction of the y-axis, whereby correction for the pattern projection position is made.

For the direction of the x-axis, besides moving the transmittable scattering mask 100 and the substrate 110 at respective specific speeds, in proportion to the ratio of pattern reduction, similar care is also taken. That is, when completing projection of divisions 100a in one line and turning to projection of divisions 100a in the next line, the charged particle beam EB is made deflected as much as the width Lx of the demarcation region 100b in the direction of the x-axis, whereby correction for the pattern projection position is made so as not to create a gap in the direction of the x-axis between regions for projection 110b.

Although, in the mask in the above description of the segmented projection type method, the demarcation region to partition prescribed patterns is in the form of a grid, it can be stripe-shaped. In the case that such a mask is utilized, the projection of each division is carried out, while scanning electrically the inside of one zonal division partitioned by the stripe-shaped demarcation region, with the electron beam, in the direction of the length.

As described above, in the segmented projection type method, a mask or a pair of masks onto which the whole segmented portions of the prescribed pattern of one chip are formed in all are used so that the throughput thereof can be greatly improved as compared with the conventional cell projection method and the variable-shaped beam exposure method. Hereat, in the case that a plurality of masks onto which the whole segmented portions of the prescribed pattern of one chip are formed in all are utilized, the number of masks required is equivalent to the number of segmentation.

Further, in the segmented projection type method, since a support structure in the form of a grid can be set over the demarcation region 100b which is formed between respective divisions 100a, bending and thermal distortion of the mask substrate which may result from irradiation of the charged particle beam can be suppressed well and projection can be performed with high accuracy.

For the electron-beam exposure of segmented projection type described above, a mask (referred to as a "scattering membrane mask", hereinafter) in which a pattern made of an electron-beam scatterer (for example, tungsten with a thickness of 50 nm or so) is formed on an electron-beam transmittable membrane with a relatively small electron-beam scattering power (for example, a silicon nitride film with a thickness of 100 nm or so) is employed and the SAL type pattern projection is conducted.

A schematic view of an ordinary SAL type optical system with a scattering membrane mask is shown in FIG. 8.

Herein the projection is made by an electron beam consisting of electrons (image-forming electrons) which are not scattered or scattered only with relatively small scattering angles, having transmitted a region of an electron-beam transmittable membrane 201a (referred to as a "membrane region" hereinafter) in a scattering membrane mask 201, on which no electron-beam scatterer 201b is formed. These image-forming electrons are focused by a first projection lens 202, and, after passing through a central opening in a limiting aperture section 203, are projected onto a resist 206 lying on a wafer 205 by a second projection lens 204. The resist 206 in the drawing is a negative one, of which an exposed portion is to remain, and shown in the form after the development for illustration. The resist can be a positive one. Meanwhile, electrons scattered with large scattering angles, having transmitted any of electron-beam scatterers 201b, are almost all cut off by a limiting aperture section 203 disposed in the cross-over position of the first projection lens or its vicinity. The image contrast is, in this way, formed on the wafer, owing to the difference in electron-beam scattering angle between the electron-beam scatterer region and the membrane region, which forms the pattern.

A description of a manufacturing method of a scattering membrane mask can be found, for example, in SPIE, Vol. 3236, pp. 190 (1998). An example of a manufacturing method of a scattering membrane mask is described below.

First, upon a silicon substrate, silicon nitride films are formed as electron-beam transmittable thin films (membranes) by the LPCVD (Low Pressure Chemical Vapour Deposition) method. The silicon nitride films are hereat, formed on the both surfaces of the silicon substrate. Subsequently, by means of the sputtering, a thin chromium film is formed as an etching stopper layer over the silicon nitride film lying on the top surface of the substrate, and thereon a tungsten layer is grown as a scatterer layer.

Next, over the silicon nitride film formed on the backside of the silicon substrate, a coating of a resist is applied and patterned, and using the formed resist pattern as a mask, the silicon nitride film is removed by reactive ion etching so as to expose the silicon substrate in a prescribed region. The tungsten layer can be formed, after this step, over the silicon nitride film lying on the top surface of the substrate.

After the removal of the resist, by carrying out wet-etching with KOH or dry etching, silicon in the exposed region of the silicon substrate is removed and thereby an opening section to expose the silicon nitride film formed on the top surface of the substrate is formed.

Thereat, over the tungsten layer lying on the top side of the substrate, a coating of a resist is applied and patterned, and using the formed resist pattern as a mask, the tungsten layer is patterned by dry etching. By removing the resist, a scattering membrane mask in which a tungsten layer pattern is formed on the silicon nitride film is accomplished. The exposed portion of the thin chromium film is also removed by means of wet etching.

Since the scattering membrane mask described above is a mask in which a pattern is formed through growing an electron-beam scatterer on a very thin electron-beam transmittable membrane of 100 nm or so, its fabrication is generally a difficult task and a problem of a dispersion in the film thickness of the electron-beam transmittable membrane is particularly liable to happen. The dispersion of the thickness arising in the membrane region (the region the electron-beam transmittable membrane alone occupies) causes a dispersion in the irradiation intensity of image-forming electrons which irradiate the resist on the wafer and leads to deterioration of linewidth accuracy of the pattern. That is, when some electrons transmit thicker parts of the membrane region, the scattering angles of those electrons become larger, which increases the number of electrons cut off by a limiting aperture section and decreases the number of electrons to irradiate the resist on the wafer so that the corresponding irradiation intensity is lowered. This results in thinning of the pattern, if the resist utilized is a negative one.

The thickness of the electron-beam transmittable membrane in the scattering membrane mask is, hitherto, measured during its manufacturing step. For example, at the time when deposition of an electron-beam transmittable membrane material such as SiN on a silicon substrate is completed, its thickness is measured by a known method. In such a measurement, the thickness of the membrane region in the finished mask cannot be obtained. Moreover, as the measurement of the film thickness is made prior to pattern formation, a film thickness distribution of the membrane regions on the pattern region surface of the finished mask cannot be known, either. Further, even if tried, with any ordinary conventional measuring method, the measurement of the thickness of the membrane region in the finished mask is considerably difficult, because the membrane region which is the very measuring object is partly situated between minute scatterer patterns, and besides the silicon substrate is absent on the backside of the membrane region (the open space is present there).

In Japanese Patent Application Laid-open No. 258703/1993, there are disclosed an electron-beam test method wherein, with a charged particle beam being sent forth, the surface of a substrate is scanned and, at least, charged particles of one type among three types that come out from either the top face or the bottom face of that substrate, namely, secondary charged particles, back-scattered charged particles and transmitted charged particles, are detected and a system thereof. This method and system are described to be applicable to tests of an X-ray mask, a mask for electron-beam and a stencil mask, and able to detect defects of various types as well as distinguish those defects. With respect to the measurement of the film thickness of the substrate, however, nothing is mentioned therein.

SUMMARY OF THE INVENTION

An object of the present invention is to provide a test method of a scattering membrane mask for electron-beam exposure wherein, even after mask fabrication, a film thickness distribution of membrane regions thereof can be readily measured as well as a method of electron-beam exposure wherein a pattern can be formed with high linewidth accuracy.

The present invention relates to a test method of a mask for electron-beam exposure which has a pattern region in which, by forming an electron-beam scatterer in prescribed shape on an electron-beam transmittable thin film, a scattering region with said electron-beam scatterer and a membrane region without said electron-beam scatterer are formed in prescribed pattern shape; wherein electron-beam irradiation onto a tested mask is carried out in a plurality of times, with each irradiated region subjected to irradiation at a time being scanned with the electron beam, and through detection of transmitted electrons which is made for each irradiated region subjected to irradiation at a time, the value for $I_{TE}/\alpha$ given by dividing a cumulative intensity of the transmitted electrons $I_{TE}$ for an irradiated region subjected to irradiation at a time by a pattern density $\alpha$ of a membrane region within said irradiated region is obtained for each one of a plurality of irradiated regions, whereby data of a relative film thickness distribution for the membrane regions in the mask face are acquired.

Further, the present invention relates to the test method of a mask for electron-beam exposure as set forth above, wherein an electron-beam transmittance $I_{TE}/(\alpha \cdot I_{IE})$ for each irradiated region subjected to irradiation at a time is obtained from a cumulative intensity of the transmitted electrons $I_{TE}$ for an irradiated region subjected to irradiation at a time, a pattern density a of a membrane region within said irradiated region and a cumulative intensity of the irradiating electron beam $I_{IE}$ applied onto said irradiated region; and, using the relationship between the electron-beam transmittance and the normalized mask thickness $t_{nor}$ that is expressed by Equation (1), together with each obtained electron-beam transmittance $I_{TE}/(\alpha \cdot I_{IE})$, the corresponding average normalized mask thickness of a membrane region for an irradiated region subjected to irradiation at a time is made out for each one of a plurality of irradiated regions.

$$t_{nor}=t_m/R_G \quad (1)$$

where $t_m$ is the thickness of the mask (the membrane region) and $R_G$ is the Grün range.

Further, the present invention relates to the test method of a mask for electron-beam exposure as set forth above, wherein the average film thickness of a membrane region of each irradiated region subjected to irradiation at a time is made out by multiplying the average normalized mask thickness of a membrane region obtained for each irradiated region subjected to irradiation at a time by the Grün range, whereby data of a film thickness distribution for the membrane regions in the mask face are acquired.

Further, the present invention relates to the test method of a mask for electron-beam exposure as set forth above, wherein the average film thickness of a membrane region of each irradiated region subjected to irradiation at a time is made out from the average normalized mask thickness of a membrane region obtained for each irradiated region subjected to irradiation at a time, using Equation (1) and Equation (2), whereby data of a film thickness distribution for the membrane regions in the mask face are acquired.

$$R_G=(4.0 \times 10^{-2}/\rho)V_{acc}^{1.75}[\mu m] \quad (2)$$

where $\rho$ is the density of the mask material in g/cm³ and $V_{acc}$ is the accelerating voltage in kV.

Further, the present invention relates to the test method of a mask for electron-beam exposure as set forth above, wherein a converging lens that makes the transmitted electrons having transmitted a membrane region of the tested mask converge is placed and besides, in the cross-over position of said converging lens or its vicinity, a limiting aperture section is disposed, and, through the detection of the transmitted electrons passing through the central opening in said limiting aperture section, a cumulative intensity of the transmitted electrons $I_{TE}$ for each irradiated region subjected to irradiation at a time is obtained.

Further, the present invention relates to a scattering-angle limiting type electron-beam exposure method of segmented projection type using a mask which has a pattern region in which, by forming an electron-beam scatterer in prescribed shape on an electron-beam transmittable thin film, a scattering region with said electron-beam scatterer and a membrane region without said electron-beam scatterer are formed in prescribed pattern shape, and on which a prescribed primary pattern that is to be transferred for one chip or a portion of several segments thereof is formed, being segmented into a plurality of divisions; wherein said mask is tested in any test method of the present invention as set forth above and, thereat, electron-beam irradiation is carried out with each division of said mask functioning as an irradiated region subjected to irradiation at a time, and thereby an average film thickness or normalized mask thickness of a membrane region in each division is obtained; and from the average film thickness or normalized mask thickness obtained for each division of said mask, the corresponding aperture transmission of the membrane region of the division is made out through the use of the relationship between the film thickness and the aperture transmission which is obtained beforehand, setting the aperture angle at that of a limiting aperture section in an electron-beam exposure system that is to be used and the accelerating voltage at that for making the electron-beam exposure; and from the aperture transmission obtained for each division of said mask, a varying degree of the electron-beam exposure time for applying irradiation to each division of the mask is evaluated so that an identical amount of exposure dose may be given to each region on a substrate, each corresponding to a division of the mask; and in accordance with the varying degree of the electron-beam exposure time obtained for each division of said mask, the electron-beam exposure is applied to each division of the mask one by one, whereby the prescribed primary pattern is transferred.

Further, the present invention relates to the electron-beam exposure method as set forth above, wherein, from the pattern density a obtained for each division of the mask, a corresponding extent of refocusing for each division is determined using the relationship between the beam current and the defocus length which is measured beforehand on a substrate in an electron-beam exposure system that is to be used, and while correcting the focus in accordance with the extent of refocusing obtained for each division, the electron-beam exposure is applied to each division of the mask one by one, whereby the prescribed primary pattern is transferred.

In a test method of the present invention, even after mask fabrication, data concerning a film thickness distribution for the membrane regions within a mask face can be readily obtained without making any destructive tests. Further, the use of the pattern density obtained through detection of secondary electrons that is carried out concurrently with detection of transmitted electrons and the subsequent image processing thereof makes it possible to perform a film thickness inspection with a higher accuracy. Moreover, a test of ordinary pattern defects can be made at the same time by the detection of secondary electrons and the image processing so that a mask test can be conducted with great efficiency.

Further, in a method of electron-beam exposure of the present invention, measurements of a scattering membrane mask that is to be used are made by a test method of the present invention and data concerning the film thickness of a membrane region for each division are collected, and on the basis of these obtained data, the projection condition is determined, and, under that projection condition, the projection is carried out. In this way, the pattern formation can be carried out with high linewidth accuracy, regardless of a dispersion of the mask thickness.

DETAILED DESCRIPTION OF THE PREFERRED EMBODIMENTS

The preferred embodiments of the present invention are described below.

A test method of the present invention is useful for any test of the scattering membrane mask utilized in the SAL type electron-beam exposure method of segmented projection type, though particularly suited for the measurement of the film thickness distribution of the membrane regions in the scattering membrane mask. Furthermore, when the electron-beam exposure of segmented projection type is performed, using the data concerning the film thickness distribution of the mask which are obtained by this method, the pattern formation thereat can achieve high linewidth accuracy.

Figure 1:
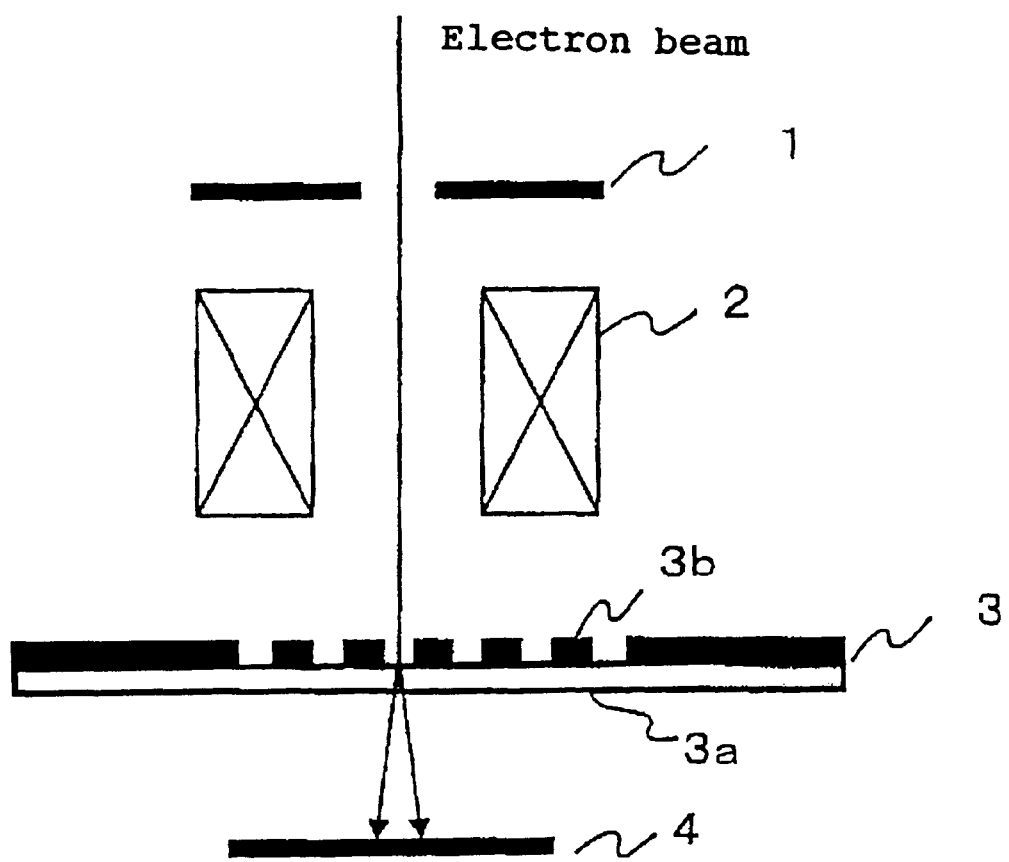
FIG. 1 is a schematic diagram showing one example of an optical system in a test method according to the present invention.

As a testing system used in a test method of the present invention, an ordinary SEM (Scanning Electron Microscope) equipped with a transmitted electron detector and a secondary electron detector can be employed. A schematic diagram of one example of an optical system used in a test method of the present invention is shown in FIG. 1.

Referential numeral 1 indicates a secondary electron detector; 2, a projection lens; 3, a tested mask (3a, an electron-beam transmittable membrane and 3b, an electron-beam scatterer) and 4, a transmitted electron detector. Other general components such as a deflector and a stage are omitted from the drawing.

Figure 2:
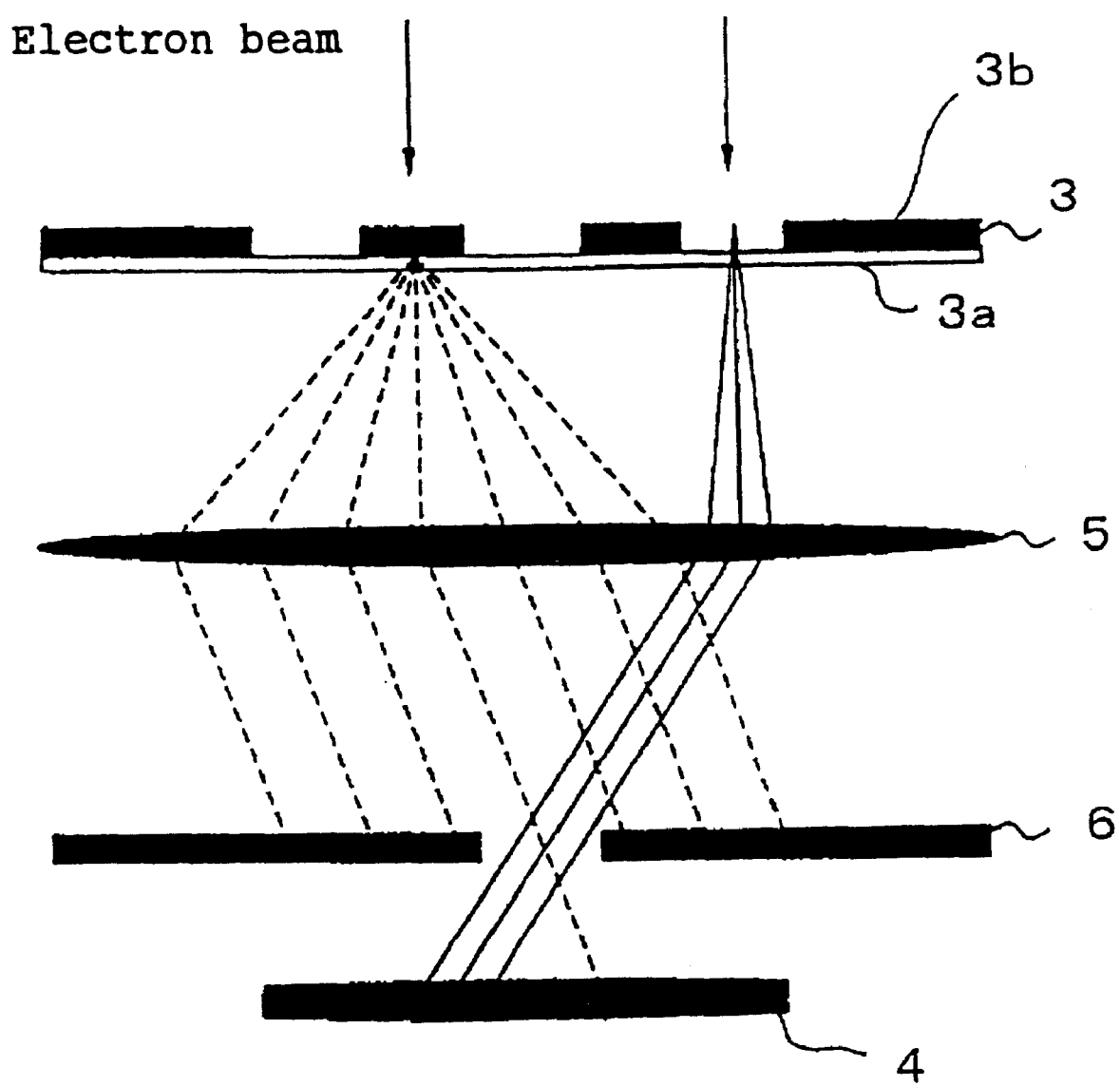
FIG. 2 is a schematic diagram showing another optical system in a test method according to the present invention.

In a test method of the present invention, in order to obtain data concerning the thickness of the membrane regions in a scattering membrane mask, the detection of electrons transmitted the membrane regions of the mask must be conducted. Hereat, for the purpose of achieving a higher accuracy for the detection, it is preferable that either the detection is made under the condition that electron-beam scatterers $3b$ do not allow electrons to transmit, or, as shown in FIG. 2, a converging lens 5 to make the transmitted electrons converge is set between a tested mask 3 and a transmitted electron detector 4 and a limiting aperture section 6 is also disposed in the cross-over position of this converging lens or its vicinity. When such an arrangement as shown in FIG. 2 is taken, electrons transmitted scatterer parts of the tested mask are almost all cut off by the limiting aperture section 6 because of their large scattering angles. As a result, regardless of the test conditions, electrons detected by the transmitted electron detector can be practically considered as electrons transmitted the membrane regions of the mask.

In a test method of the present embodiment, electron beam irradiation onto a mask is carried out in a plurality of times with each irradiated region subjected to irradiation at a time (referred to as "subfield", hereinafter) being scanned with the electron beam, the detection of the transmitted electrons and the secondary electrons is made. Through the detection of the transmitted electrons, the cumulative intensity of the transmitted electrons $I_{TE}$ for each subfield is obtained. Meanwhile, through the detection of the secondary electrons, a pattern image for each subfield is formed and, with this pattern image, a pattern density a for each subfield (pattern density of the membrane region therein) is acquired.

The quotient $I_{TE}/\alpha$ given by dividing the cumulative intensity of the transmitted electrons $I_{TE}$ by the pattern density α represents the intensity of the transmitted electrons per unit, and, if the pattern density thereof is 1 (in other words, the entire area in the subfield is the membrane region) it indicates the cumulative intensity of the transmitted electrons for each subfield. This value $I_{TE}/\alpha$ reflects the average film thickness of the membrane region in each subfield. That is, when the thickness of the membrane regions is uniform within the mask face, $I_{TE}/\alpha$ takes a constant value. On the other hand, if a thinner part is present, $I_{TE}/\alpha$ for the subfield including the thinner part becomes comparatively large, and if a thicker part is present, $I_{TE}/\alpha$ for the subfield including the thicker part becomes comparatively small. Consequently, by getting $I_{TE}/\alpha$ for every subfield, discrepancies in the average film thickness of the membrane region among subfields, namely, a relative film thickness distribution (an information on the dispersion of the film thickness) of the membrane regions in the mask face can be acquired.

Further, from $I_{TE}$ and α obtained for each subfield as well as the cumulative intensity of the irradiating electron beam $I_{IE}$ applied onto any one of subfields, the average electron-beam transmittance $I_{TE}/(\alpha \cdot I_{IE})$ for each subfield may be made out and then, using the relationship between the electron-beam tansmittance and the normalized mask thickness described below, with this average electron-beam transmittance $I_{TE}/(\alpha \cdot I_{IE})$, the corresponding average normalized mask thickness of the membrane region may be obtained for each one of a plurality of subfields. The average normalized mask thickness of the membrane region obtained for every subfield can provide a relative film thickness distribution for the membrane regions in the mask face.

Further, the average film thickness of the membrane region of each subfield may be made out by multiplying the average normalized mask thickness of the membrane region of each subfield by the Grün range. Although the obtained film thickness is the average value of each subfield, this produces data of an absolute film thickness distribution of the membrane regions in the mask face, while the average normalized mask thickness of the membrane region obtained for each subfield only produces data of a relative film thickness distribution.

In order to obtain $I_{TE}/\alpha$ and the normalized mark thickness for each subfield and acquire data concerning the film thickness distribution of the membrane regions in a mask face or the average film thickness of the membrane region of each subfield as described above, it is preferable to set the accelerating voltage of the electron beam that irradiates the mask, with the film thickness of the membrane regions of the mask considered.

The accelerating voltage of the electron beam is preferably set so as to make the normalized mask thickness $t_{nor}$ given the following Equation (1) become not less than 0.2 but not more than 0.8. Viewed from the points of S/N ratio (signal-to-noise ratio) and measuring accuracy, the normalized mask thickness is more preferable to be not less than 0.3 but not more than 0.7. Here, for $t_m$ in Equation (1), the designed value for the thickness of the electron-beam transmittable membrane in mask fabrication can be employed.

$$t_{nor}=t_m/R_G \tag{1}$$

where $t_m$ is the thickness of the mask (the membrane region) and $R_G$ is the Grün range. The Grün range itself is given by the following Equation (2).

$$R_G=(4.0\times10^{-2}/\rho)V_{acc}^{1.75}[\mu m] \tag{2}$$

where $\rho$ is the density of the mask material in g/cm$^3$ and $V_{acc}$ is the accelerating voltage in kV. For example, when the accelerating voltage $V_{acc}$ is set so as to make the normalized mask thickness $t_{nor}$ become 0.5, the accelerating voltage $V_{acc}$ may be set in such a way that the Grün range becomes twice the mask thickness (for example, the designed value for the thickness of the electron-beam transmittable membrane in mask fabrication).

Figure 3:
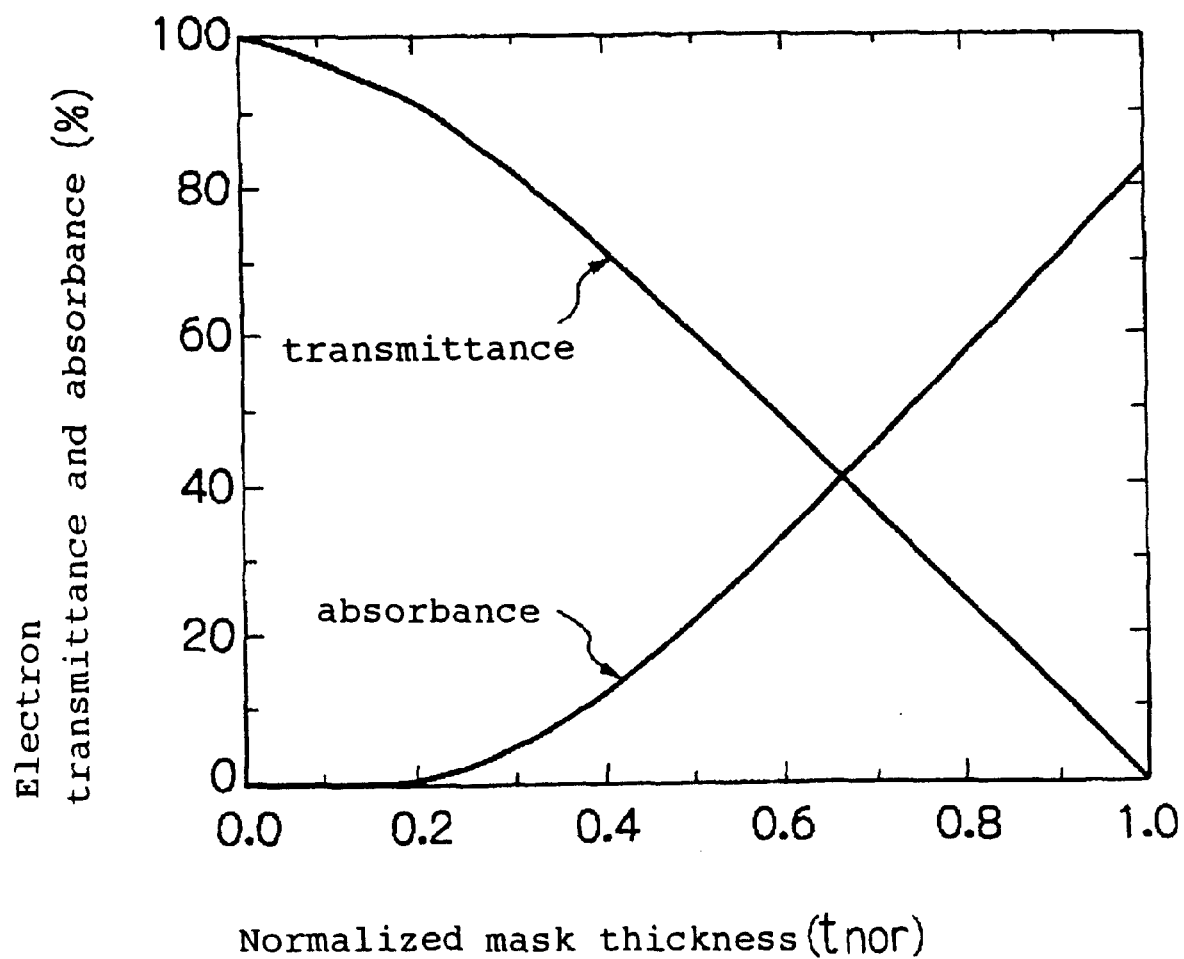
FIG. 3 is a graph showing the relationships between the normalized mask thickness and the electron-beam transmittance and absorbance.

The relationship between the normalized mask thickness and the electron-beam transmittance is described in detail by the present inventors in J. Vac. Sci. Technol. B15, pp. 2263 (1997). FIG. 3 is a graph equivalent to FIG. 7 in this publication and showing the relationship between the normalized mask thickness $t_{nor}$ expressed by Equation (1) and the electron transmittance and absorbance. Further the reflectance is obtained by subtracting the sum of these two from 100%. As shown in FIG. 3, when the normalized mask thickness $t_{nor}$ is 0.5, the electron transmittance is approximately 60%.

In Equation (1) yielding an expression for the normalized mask thickness $t_{nor}$, if the accelerating voltage of the electron beam is constant, the normalized mask thickness $t_{nor}$ changes with the film thickness $t_m$. A change in the normalized mask thickness $t_{nor}$ is, as clearly seen in FIG. 3, accompanied by a change in the electron transmittance. In effect, provided that the accelerating voltage is constant, it is possible to obtain the electron transmittance by detecting the intensity (the number) of the transmitted electrons and then make out the normalized mask thickness $t_{nor}$ which corresponds to the obtained transmittance, using the relationship shown in FIG. 3. In the present embodiment, as described above, from $I_{TE}$ and $\alpha$ obtained through the detection of the transmitted electrons and the secondary electrons for each subfield as well as the cumulative intensity of the irradiating electron beam $I_{IE}$ applied onto any one of subfields, the average electron-beam transmittance $I_{TE}/(\alpha \cdot I_{IE})$ for each subfield may be calculated, and then, using the relationship between the electron-beam transmittance and the normalized mask thickness shown in FIG. 3, the average normalized mask thickness of the membrane region of each subfield corresponding to this average transmittance can be obtained. Further, the average film thickness of the membrane region of each subfield may be made out by multiplying this average normalized mask thickness by the Grün range.

Hereat, when the normalized mask thickness $t_{nor}$ is 0.2 or more, and especially when it is in the range above 0.3, the relationship between the electron-beam transmittance Tm (%) and the normalized mask thickness $t_{nor}$ shown in FIG. 3 can be approximated with, for example, the following Equation (3), $$Tm\ (\%)=a\cdot t_{nor}+b \tag{3}$$

where a and b are constants. The above constants can be replaced by a=−120 and b=120, respectively.

In a test method of the present invention, when testing a scattering membrane mask having a pattern region which is formed in such a way that a prescribed primary pattern that is to be transferred for one chip or a portion of several segments thereof is segmented into a plurality of divisions, it is preferable to carry out the electron beam irradiation, utilizing each of these divisions as an irradiated region subjected to irradiation at a time. In this way, the average film thickness or normalized mask thickness of the membrane region for each division in the mask can be obtained. When the electron-beam exposure of segmented projection type is carried out as described below, using data of the film thickness of this sort, it is possible to make pattern formation with high linewidth accuracy.

In the afore-mentioned test method, as the pattern density of each subfield, the measured value obtained from image processing which is made from the detecting signal of the secondary electrons is utilized. However, it is possible to employ the calculated value computed from the CAD (Computer Aided Design) data set at the time of design, instead. Only the use of the measured values which reflect the actual finished dimensions can produce better test results with higher accuracy.

Further, in a test method of the present invention, using the secondary electron detecting signal and making image processing, the pattern defect inspection may be simultaneously carried out by an ordinary comparison method (die-to-data or die-to-die comparison method).

Next, a method of electron-beam exposure of the present invention is described.

A method of electron-beam exposure of the present invention is a SAL type electron-beam exposure method of segmented projection type wherein a test of a scattering membrane mask that is to be used is conducted by a method described above, and, chiefly, data concerning a film thickness distribution of the membrane regions are collected, and, then, with the obtained data, the exposure (projection) condition is determined, and under this condition, the electron-beam exposure is made.

Figure 7:
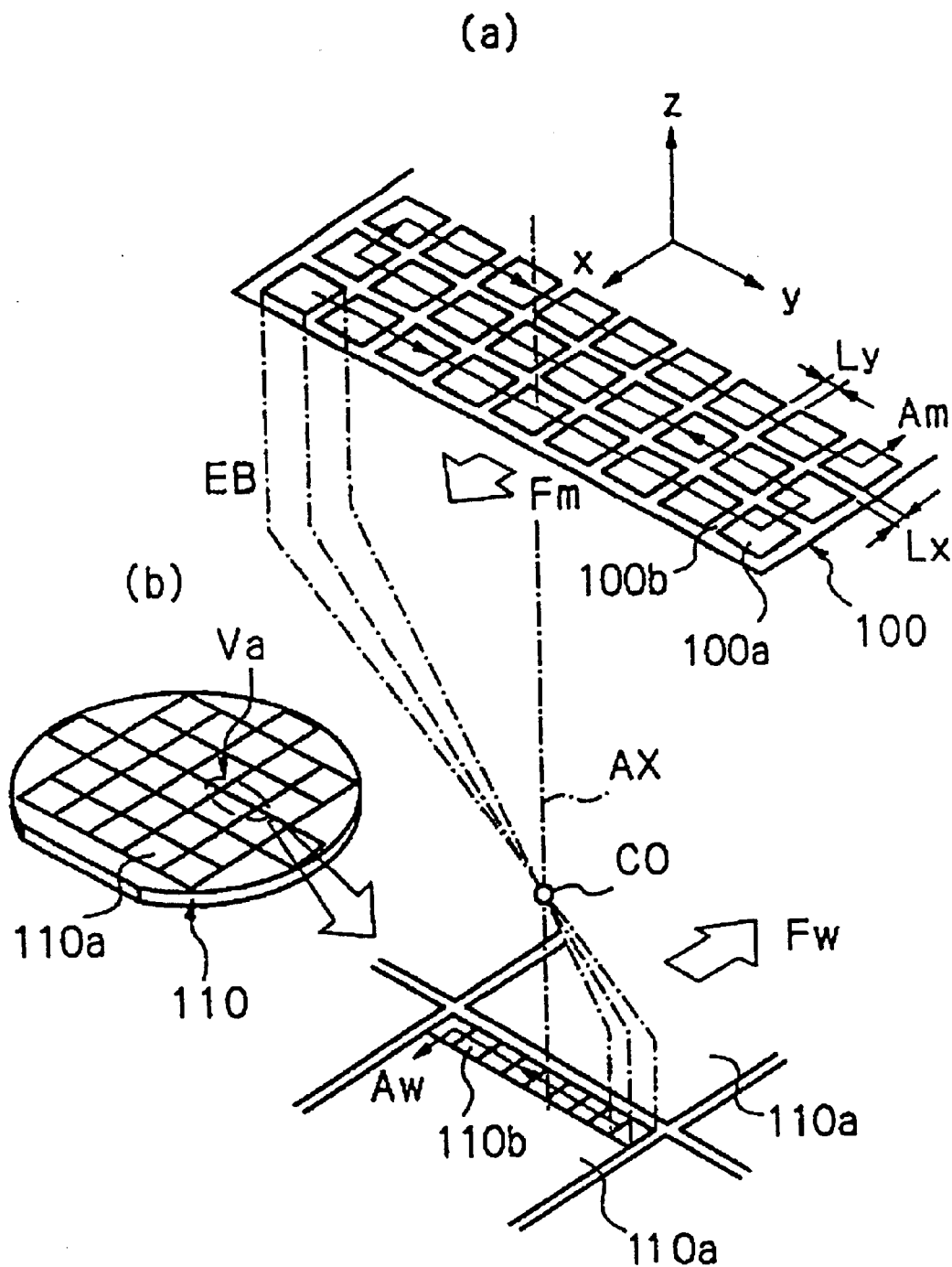
FIG. 7 is a pair of schematic diagrams in explaining one example of an electron-beam exposure method of segmented projection type.

As one example is, with reference to FIG. 7, described above, the segmented projection type method is a method in which a prescribed primary pattern that is to be transferred for one chip or a portion of several segments thereof is segmented into a plurality of divisions and, using a mask or a pair of masks on which one of segmented patterns is formed in each division thereof, the electron-beam exposure is applied to each division one by one, and thereby whole of the prescribed pattern is transferred.

Figure 8:
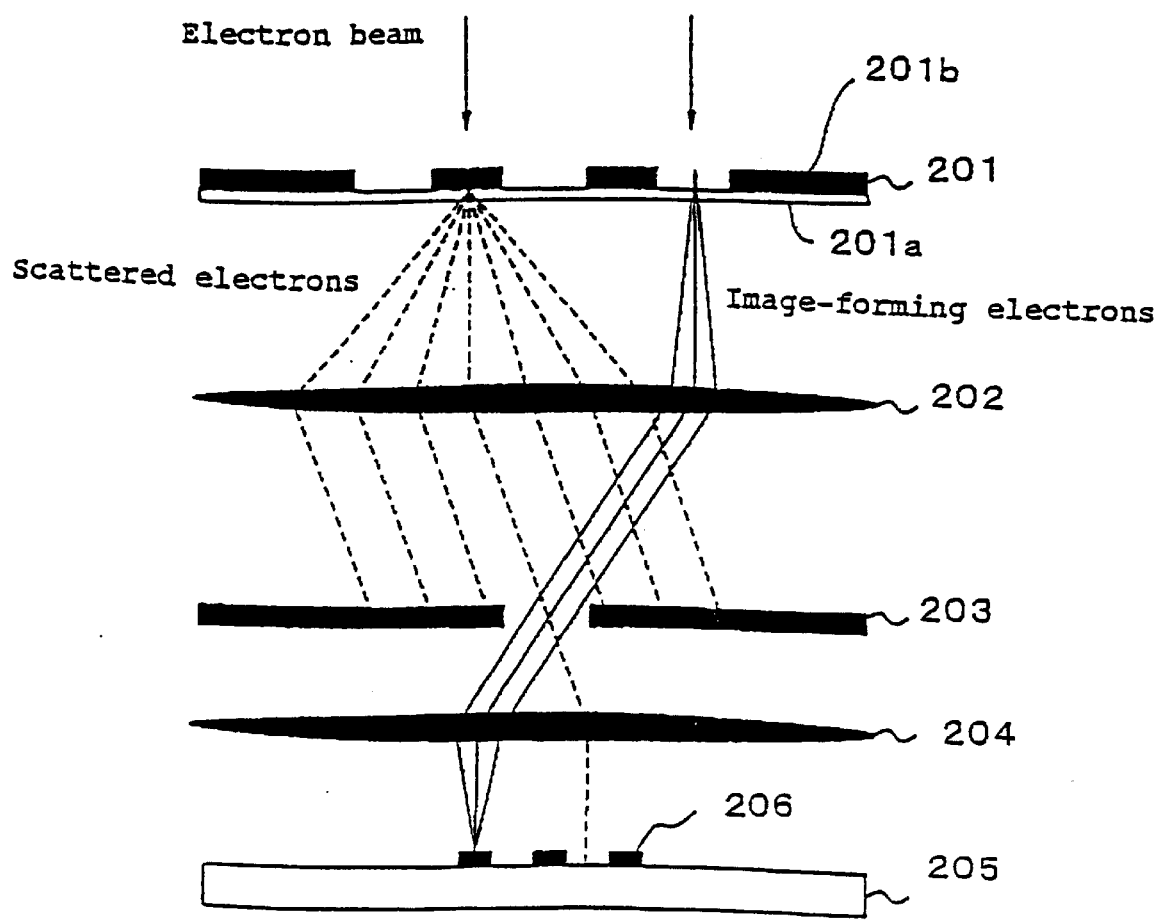
FIG. 8 is a schematic diagram showing an ordinary optical system in an electron-beam exposure method of scattering-angle limiting type.

Further, as one example is, with reference to an optical system shown in FIG. 8, described above, the SAL type method is a method in which a scattering membrane mask is used, and a limiting aperture section is set to control the amount of the scattered electrons scattered by this mask to pass through, whereby a scattering contrast is formed from differences in the scattering angles of electrons having transmitted this mask and the pattern projection is accomplished.

As a mask utilized in a method of electron-beam exposure of the present invention, there can be employed a known scattering membrane mask which has a pattern region in which, by growing an electron-beam scatterer in prescribed shape on an electron-beam transmittable thin film (membrane), a scattering region with this electron-beam scatterer grown. and a membrane region without any electron-beam scatterer grown are formed in prescribed pattern shape, and on which a prescribed primary pattern that is to be transferred for one chip or a portion of several segments thereof is formed, being segmented into a plurality of divisions.

Figure 4:
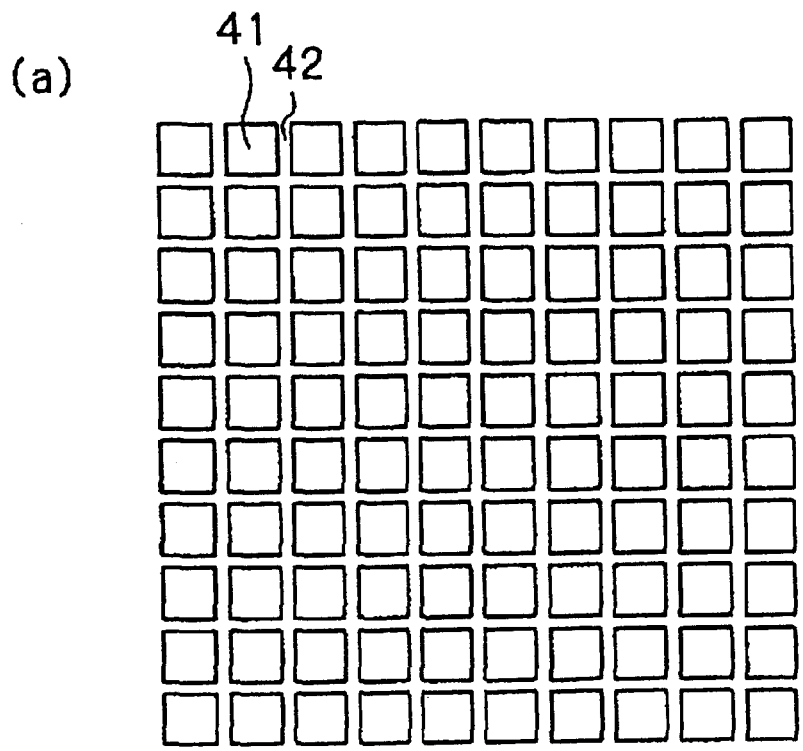
FIG. 4 is a pair of schematic plan diagrams, each showing an example of a pattern region in a mask according to the present invention.
Figure 4:
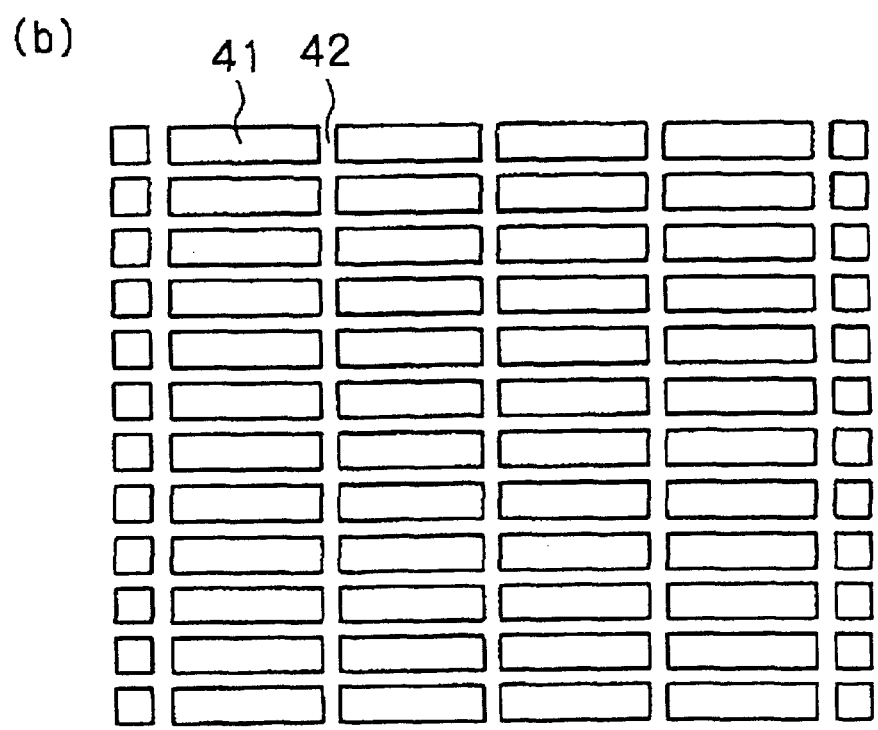

Schematic plan diagrams, each showing an example of a pattern region of a mask, are presented in FIG. 4. In FIG. 4(a), a pattern region of a mask is partitioned into a plurality of square divisions 41 with a demarcation region 42 where no pattern is laid, and in each of these divisions 41 there is formed one of segmented pattern into which a prescribed primary pattern that is to be transferred for one chip or a portion of several segments thereof is segmented. In the demarcation region 42, a supporting element is set so that mechanical strength of the mask is heightened. The shape of a division 41 is not limited to be square or rectangular as shown in FIG. 4(a), and can be zonal as shown in FIG. 4(b). In general, when divisions of a mask are square or rectangular as shown in FIG. 4(a), each division of the mask is irradiated by one shot of electron-beam irradiation. In the case that divisions are zonal as shown in FIG. 4(b), however, the whole area within one division is irradiated by scanning in the direction of the length of the division with the electron beam whose irradiation width is the width of the division.

A scattering membrane mask used in the present invention can be fabricated with known materials by a conventional manufacturing method.

In a method of electron-beam exposure of the present embodiment, a mask utilized therein is first examined by an afore-mentioned test method and the average film thickness of the membrane region in each division is obtained. Thereat, irradiation of the electron beam is carried out with a division of the mask functioning as a subfield, and a test of the mask is performed.

Next, the relationship between the mask thickness (the thickness of an electron-beam transmittable thin film made of the same material as the mask that is to be used) and the aperture transmission is obtained under the condition that an aperture angle is set at that of a limiting aperture section in an electron-beam exposure system that is to be used and an accelerating voltage, at that for making the exposure, and, using this relationship, the aperture transmission for each division of the mask corresponding to the average film thickness obtained for each division of the mask is made out.

Figure 5:
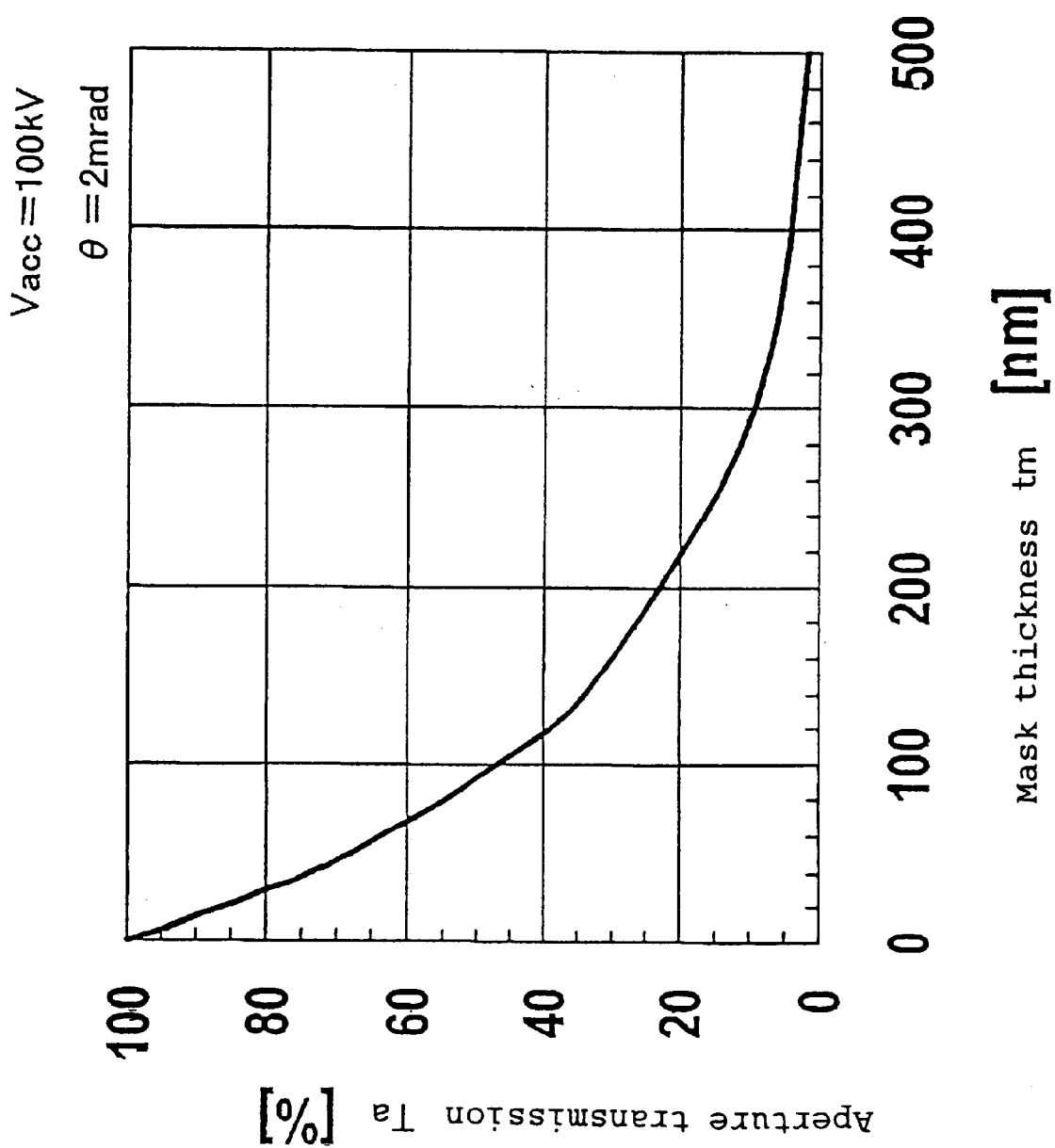
FIG. 5 is a graph showing an example of the relationship between the mask thickness and the aperture transmission.

FIG. 5 shows one example (the mask material is silicon; the aperture angle is at 2 mrad and the accelerating voltage $V_{acc}$ is at 100 kV) of the relationship between the mask thickness and the aperture transmission obtained by a Monte Carlo simulation. In FIG. 5, a case in which a thin silicon film is used as a mask is presented but, even using another electron-beam transmittable membrane such as a silicon nitride film, similar relationship can be obtained. Further, in an electron-beam exposure system, the aperture angle θ is generally set at 0.5–2.5 mrad and the accelerating voltage, at 75–120 kV.

Figure 6:
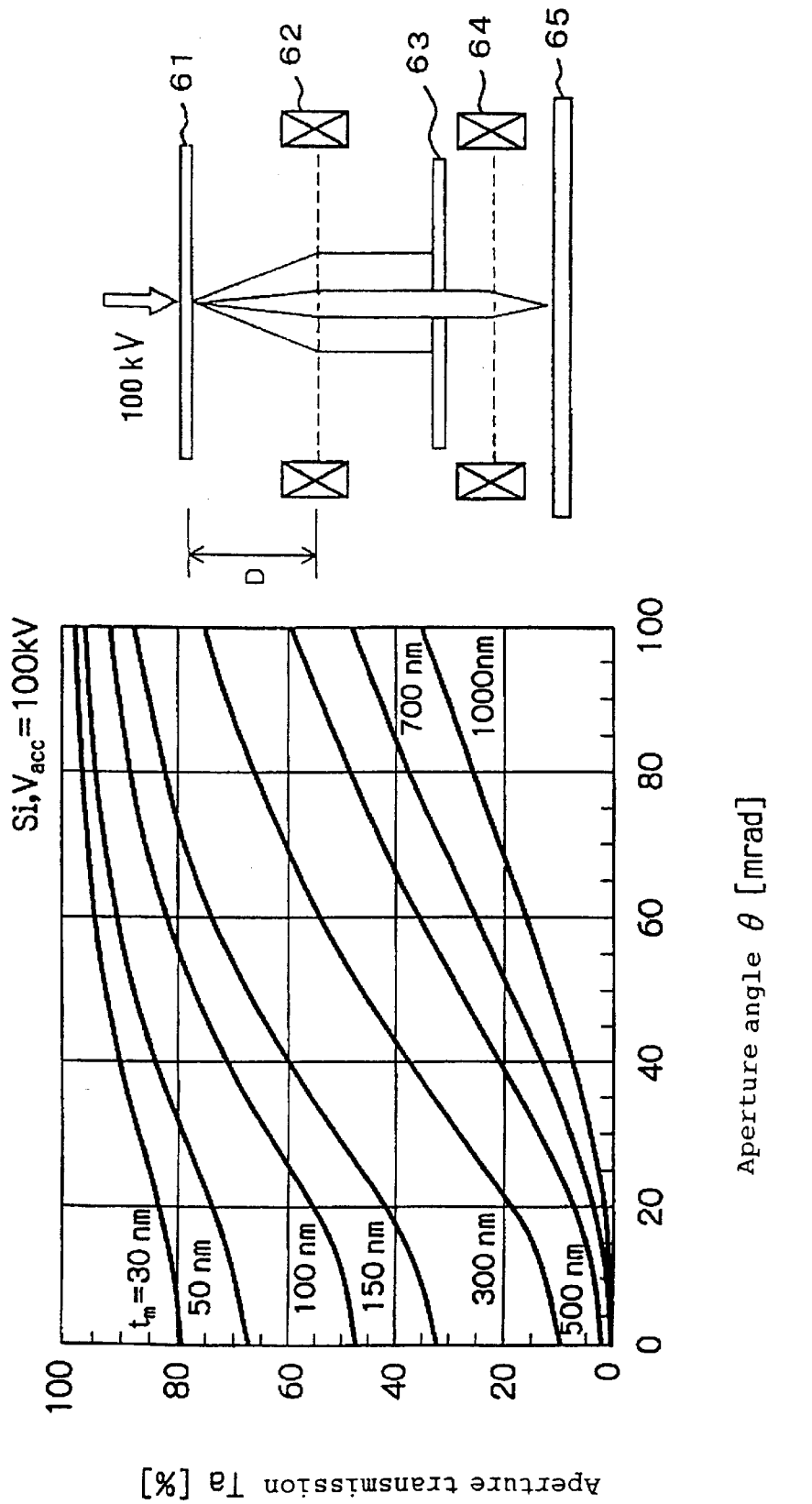
FIG. 6 is a diagram in explaining the aperture transmission and the relationship between the aperture angle and the aperture transmission.

The aperture transmission herein indicates the ratio of the number of electrons falling on a wafer to the number of electrons irradiating on a mask, in an optical system shown in FIG. 6(b). In FIG. 6(b), referential numeral 61 indicates a mask (an electron-beam transmittable thin film) where no opening or scatterers are formed; 62, a first projection lens; 63, a limiting aperture section; 64, a second projection lens and 65, a wafer. Further, the relationship between the aperture angle θ (rad) and the radius r of an opening in the central section of the limiting aperture section 63 is expressed by r≈D·θ, where D is the distance between the mask 61 and the first projection lens 62. For illustration, the relationship between the aperture transmission Ta (%) and the aperture angle θ (mrad) of a limiting aperture in the case that a thin silicon film is utilized as a mask 61 (the accelerating voltage $V_{acc}$=100 kV) is shown in FIG. 6(a) (cf. J. Vac. Sci. Technol. B 17, No. 6, pp. 2860 (1999)). As seen clearly in this drawing, the larger the aperture angle θ is ( the larger the radius of the opening is), the higher the aperture transmission becomes. Nevertheless, the aperture angle θ is generally set to be 0.5 to 2.5 mrad and, in such a range, the dependence of the aperture transmission on the aperture angle is small and the aperture transmission mainly depends on the mask thickness.

As described above, if the relationship between the mask thickness tm and the aperture transmission Ta is obtained beforehand under the condition that the aperture angle is set at that of a limiting aperture section in an electron-beam exposure system that is to be used and the accelerating voltage, at that for making the exposure, the aperture transmission can be made out from the mask thickness, using this relationship. In this way, the aperture transmission $Ta_{SF}$ of the membrane region for each division of the mask can be acquired from the average film thickness of the membrane region for each division of the mask obtained by the mask test.

Next, from the aperture transmission $Ta_{SF}$ obtained for each division of the mask, the varying degree of the electron-beam exposure time for applying irradiation to each division of the mask is evaluated. In this instance, the exposure time is varied so that the identical amount of exposure dose D [μC/cm$^2$] may be given to every resist region for projection on a wafer, each resist region for projection corresponding to a division of the mask, and, in other words, the product of the current density of the transmitted electrons $J_{SF}$ [A/cm$^2$] in a division of the mask and the exposure time [s] may be held constant. For example, when a division A whose average film thickness of the membrane region of the mask is 150 nm is compared with a division B having double average film thickness (300 nm), the aperture transmission of the division B (10%) is ⅓ as much as the aperture transmission of the division A that is approximately 30%, as seen in FIG. 5. Therefore, as the current density is proportional to the aperture transmission, the electron-beam exposure time for the division B should be made three times as long as that for the division A to achieve the identical amount of exposure dose in both resist regions for projection on the wafer, the resist regions corresponding to the division A and B of the mask, respectively.

While the relationship between the mask thickness $t_m$ and the aperture transmission Ta, as shown in FIG. 5, is hereat used, the normalized mask thickness $t_{nor}$ can replace the mask thickness $t_m$, according to Equation (1), and the relationship between the normalized mask thickness $t_{nor}$ and the aperture transmission Ta can be utilized instead, as the accelerating voltage $V_{acc}$ and the mask material are unchanged.

Following the varying degree of the electron-beam exposure time for each division of the mask which is determined as above, the electron-beam exposure is applied to each division of the mask, and thereby the prescribed primary pattern is transferred to the resist layer on the wafer.

On that occasion, if secondary electrons are detected in the step of testing a mask and the pattern density α for each division of the mask is obtained by image processing, the optimum extent of refocusing for each division may be found out from the pattern density α and the electron-beam may be applied to each division for projection with the optimum extent of refocusing. This makes it possible to conduct the projection with best focus at all times regardless of patterns and achieve high resolution and linewidth accuracy.

From the pattern density α, the optimum extent of refocusing for each division of the mask may be determined in the following way. The relationship between the beam current and the defocus length that exists on a wafer is specific to an individual electron-beam exposure system so that it is necessary to examine experimentally beforehand and observe the defocus length in response to the change of the beam current while changing the beam current in an electron-beam exposure system that is to be used. The beam current for each division is calculated as the product of the pattern density α, the area (a fixed value) of the irradiated region with the electron beam (the subfield) and the current density, and, using the pre-examined relationship between the beam current and the defocus length, the corresponding defocus length for each division is learnt. A table or a relationship equation obtained beforehand determines the extent of refocusing for correcting the defocus length. In this instance, the pattern density driven from the CAD data of the pattern can be used. However, if, to determine the extent of refocusing, the pattern density and the current density obtained through a test are used, optimum refocusing with consideration to a variation of the beam current caused by the film thickness can be achieved. Therefore focus correction with a higher accuracy can be accomplished.

What is claimed is:

1. A test method of a mask for electron-beam exposure which has a pattern region in which, by forming an electron-beam scatterer in prescribed shape on an electron-beam transmittable thin film, a scattering region with said electron-beam scatterer and a membrane region without said electron-beam scatterer are formed in prescribed pattern shape; wherein electron-beam irradiation onto a tested mask is carried out in a plurality of times, with each irradiated region subjected to irradiation at a time being scanned with the electron beam, and through detection of transmitted electrons which is made for each irradiated region subjected to irradiation at a time, the value for $I_{TE}/\alpha$ given by dividing a cumulative intensity of the transmitted electrons $I_{TE}$ for an irradiated region subjected to irradiation at a time by a pattern density α of a membrane region within said irradiated region is obtained for each one of a plurality of irradiated regions, whereby data of a relative film thickness distribution for the membrane regions in the mask face are acquired.

2. The test method of a mask for electron-beam exposure according to claim 1, wherein an electron-beam transmittance $I_{TE}/(\alpha \cdot I_{IE})$ for each irradiated region subjected to irradiation at a time is obtained from a cumulative intensity of the transmitted electrons $I_{TE}$ for an irradiated region subjected to irradiation at a time, a pattern density α of a membrane region within said irradiated region and a cumulative intensity of the irradiating electron beam $I_{IE}$ applied onto said irradiated region; and, using the relationship between the electron-beam transmittance and the normalized mask thickness $t_{nor}$ that is expressed by Equation (1), together with each obtained electron-beam transmittance $I_{TE}/(\alpha \cdot I_{IE})$, the corresponding average normalized mask thickness of a membrane region for an irradiated region subjected to irradiation at a time is made out for each one of a plurality of irradiated regions.

$$t_{nor}=t_m/R_G \quad (1)$$

where $t_m$ is the thickness of the mask (the membrane region) and $R_G$ is the Grün range.

3. The test method of a mask for electron-beam exposure according to claim 2, wherein the average film thickness of a membrane region of each irradiated region subjected to irradiation at a time is made out by multiplying the average normalized mask thickness of a membrane region obtained for each irradiated region subjected to irradiation at a time by the Grün range, whereby data of a film thickness distribution for the membrane regions in the mask face are acquired.

4. The test method of a mask for electron-beam exposure according to claim 2, wherein the average film thickness of a membrane region of each irradiated region subjected to irradiation at a time is made out from the average normalized mask thickness of a membrane region obtained for each irradiated region subjected to irradiation at a time, using Equation (1) and Equation (2), whereby data of a film thickness distribution for the membrane regions in the mask face are acquired.

$$R_G=(4\times10^{-2}/\rho)V_{acc}^{1.75}[\mu m] \quad (2)$$

where ρ is the density of the mask material in g/cm$^3$ and $V_{acc}$ is the accelerating voltage in kV.

5. The test method of a mask for the electron-beam exposure according to claim 1 wherein the accelerating voltage of the electron beam to irradiate a tested mark is set so as to make the normalized mask thickness $t_{nor}$ given by Equation (1) become not less than 0.2 but not more than 0.8.

6. The test method of a mask for the electron-beam exposure according to claim 1, wherein, together with the detection of transmitted electrons, the detection of secondary electrons is carried out for each irradiated region subjected to irradiation at a time and a pattern image is formed from the detected secondary electrons, and then, with the obtained pattern image, a pattern density α for each irradiated region subjected to irradiation at a time is obtained.

7. The test method of a mask for the electron-beam exposure according to claim 6, wherein a test of pattern defect is performed by the detection of secondary electrons that is carried out together with the detection of transmitted electrons.

8. The test method of a mask for the electron-beam exposure according to claim 1, wherein a converging lens that makes the transmitted electrons having transmitted a membrane region of the tested mask converge is placed and besides, in the cross-over position of said converging lens or its vicinity, a limiting aperture section is disposed, and, through the detection of the transmitted electrons passing through the central opening in said limiting aperture section, a cumulative intensity of the transmitted electrons $I_{TE}$ for each irradiated region subjected to irradiation at a time is obtained.

9. The test method of a mask for the electron-beam exposure according to claim 1, wherein a scanning electron microscope (SEM) is used as a test system.

10. The test method of a mask for the electron-beam exposure according to claim 1, wherein a tested mask is a mask on which a prescribed primary pattern that is to be transferred for one chip or a portion of several segments thereof is formed, being segmented into a plurality of divisions and the electron-beam irradiation is applied thereto with said division functioning as an irradiated region subjected to irradiation at a time.

11. A scattering-angle limiting type electron-beam exposure method of segmented projection type using a mask which has a pattern region in which, by forming an electron-beam scatterer in prescribed shape on an electron-beam transmittable thin film, a scattering region with said electron-beam scatterer and a membrane region without said electron-beam scatterer are formed in prescribed pattern shape, and on which a prescribed primary pattern that is to be transferred for one chip or a portion of several segments thereof is formed, being segmented into a plurality of divisions; wherein said mask is tested in the test method according to claim 2, and, thereat, electron-beam irradiation is carried out with each division of said mask functioning as an irradiated region subjected to irradiation at a time, and thereby an average film thickness or normalized mask thickness of a membrane region in each division is obtained; and from the average film thickness or normalized mask thickness obtained for each division of said mask, the corresponding aperture transmission of the membrane region of the division is made out through the use of the relationship between the film thickness and the aperture transmission which is obtained beforehand, setting the aperture angle at that of a limiting aperture section in an electron-beam exposure system that is to be used and the accelerating voltage at that for making the electron-beam exposure; and from the aperture transmission obtained for each division of said mask, a varying degree of the electron-beam exposure time for applying irradiation to each division of the mask is evaluated so that an identical amount of exposure dose may be given to each region on a substrate, each corresponding to a division of the mask; and in accordance with the varying degree of the electron-beam exposure time obtained for each division of said mask, the electron-beam exposure is applied to each division of the mask one by one, whereby the prescribed primary pattern is transferred.

12. The method of electron-beam exposure according to claims 11, wherein, in the step of testing the mask, the accelerating voltage of the electron beam to irradiate the mask is set so as to make the normalized mark thickness $t_{nor}$ given by Equation (1) become not less than 0.2 but not more than 0.8.

13. The method of electron-beam exposure according to claim 11, wherein, in the step of testing the mask, together with the detection of transmitted electrons, the detection of secondary electrons is carried out for each division of the tested mask and a pattern image is formed from the detected secondary electrons, and then, with the obtained pattern image, a pattern density $\alpha$ for each division is obtained.

14. The method of electron-beam exposure according to claims 13, wherein, from the pattern density $\alpha$ obtained for each division of the mask, a corresponding extent of refocusing for each division is determined using the relationship between the beam current and the defocus length which is measured beforehand on a substrate in an electron-beam exposure system that is to be used, and while correcting the focus in accordance with the extent of refocusing obtained for each division, the electron-beam exposure is applied to each division of the mask one by one, whereby the prescribed primary pattern is transferred.

15. The method of electron-beam exposure according to claim 11, wherein, in the step of testing the mask, a converging lens that makes the transmitted electrons having transmitted a membrane region of the tested mask converge is placed and besides, in the cross-over position of said converging lens or its vicinity, a limiting aperture section is disposed, and, through the detection of the transmitted electrons passing through the central opening in said limiting aperture section, a cumulative intensity of the transmitted electrons $I_{TE}$ for each division of the mask is obtained.

* * * * *